(12) United States Patent
Druz et al.

(10) Patent No.: US 9,347,127 B2
(45) Date of Patent: May 24, 2016

(54) FILM DEPOSITION ASSISTED BY ANGULAR SELECTIVE ETCH ON A SURFACE

(75) Inventors: Boris L. Druz, Brooklyn, NY (US); Vincent Ip, Elmont, NY (US); Adrian Devasahavam, Commack, NY (US)

(73) Assignee: Veeco Instruments, Inc., Plainview, NY (US)

( * ) Notice: Subject to any disclaimer, the term of this patent is extended or adjusted under 35 U.S.C. 154(b) by 92 days.

(21) Appl. No.: 13/550,270

(22) Filed: Jul. 16, 2012

(65) Prior Publication Data

US 2014/0014497 A1 Jan. 16, 2014

(51) Int. Cl.
*C23C 14/22* (2006.01)
*C23C 14/08* (2006.01)
*C23C 14/16* (2006.01)
*C23C 14/35* (2006.01)

(52) U.S. Cl.
CPC .............. *C23C 14/081* (2013.01); *C23C 14/16* (2013.01); *C23C 14/225* (2013.01); *C23C 14/354* (2013.01)

(58) Field of Classification Search
CPC .............................. C23C 14/225; C23C 14/04
See application file for complete search history.

(56) References Cited

U.S. PATENT DOCUMENTS

| | | | |
|---|---|---|---|
| 4,673,475 A | 6/1987 | Windischmann | |
| 4,862,032 A * | 8/1989 | Kaufman et al. | 313/359.1 |
| 5,508,368 A | 4/1996 | Knapp et al. | |
| 5,945,677 A | 8/1999 | Leung et al. | |
| 6,063,244 A | 5/2000 | Pinarbasi | |
| 6,888,146 B1 * | 5/2005 | Leung et al. | 250/398 |
| 2003/0157812 A1 * | 8/2003 | Narwankar et al. | 438/758 |
| 2007/0076833 A1 * | 4/2007 | Becker et al. | 375/377 |
| 2009/0233438 A1 | 9/2009 | Ding et al. | |
| 2011/0089022 A1 * | 4/2011 | Druz et al. | 204/192.11 |
| 2012/0080308 A1 * | 4/2012 | Kameyama | 204/192.11 |

* cited by examiner

*Primary Examiner* — Keith Hendricks
*Assistant Examiner* — Timon Wanga
(74) *Attorney, Agent, or Firm* — Wood, Herron & Evans, LLP

(57) ABSTRACT

An ion etch assisted deposition apparatus deposits a thin film upon a substrate having a three dimensional feature, using an ion etching source and deposition source arranged at similar angles relative to the substrate and at an angle α relative to each other. The angle α is selected to be substantially equal the supplement of the angle α' formed between the three dimensional feature on the substrate and the substrate surface. In this configuration the relative flux of energetic etch ions and deposition atoms is adjusted to prevent the growth of poor quality deposited material.

22 Claims, 14 Drawing Sheets

0°

FILM DEPOSITION ASSISTED BY ANGULAR SELECTIVE ETCH ON A SURFACE

TECHNICAL FIELD

This invention is generally related to thin film deposition methods. More particularly, the invention is related to thin film deposition methods that include depositing material on a surface and etching away portions of that material in an effort to control the film of material left on the surface.

BACKGROUND

Thin film deposition methods are commonly used for the fabrication of semiconductor and other electrical, magnetic, and optical devices. However, the quality (material properties) of thin films deposited by conventional methods are often not comparable to bulk material, particularly in cases of low temperature deposition, such as when temperatures at the substrate must be kept much lower than the melting point of the films to avoid thermal damage to the devices. This is often a result of imperfections in the as-deposited film structure and morphology.

Various Ion Assisted Deposition (IAD) methods have been developed to improve the quality of deposited thin film properties at low substrate temperatures. The deposition source may be an evaporation source (thermal or electron-beam), magnetron sputtering, and the ion assist provided by an ion source, such as, for example, a Kaufman-type gridded ion source or a gridless ion source, such as an End Hall source.

IAD processes are useful for improving properties of films deposited on flat substrates because energetic ions stimulate and cause atomic displacement at the surface, as well as surface atom diffusion and desorption at low substrate temperatures. Control of the incidence angle of the ions and flux of the ions relative to that of the depositing neutral particles may be useful to affect film structure (in particular to increase the film density and/or modify film stress). The ion energies used for ion bombardment in the conventional IAD process are typically at or near the sputtering threshold of the material on the surface and the ion flux is relatively low compared to the deposition flux.

Another known ion assisted method is Dual Ion Beam Deposition, in which a primary deposition ion beam source sputters material from a deposition target to the substrate and a secondary "assist" ion beam source is directed to the surface of the substrate. This method, like other ion assist methods, has the advantage that the angle of incidence of the assist ion beam can be controlled to affect the film properties. Yet another type of IAD method used for plasma-based thin film deposition processes such as sputtering is biased substrate deposition. In this method, ions in the plasma are directed to the substrate by an electric field. However, in this method the ion bombardment of the substrate occurs at essentially normal incidence. In experiments undertaken by the present inventors, Aluminum Oxide films formed by this method tend to form seams at the edges of the step features, where material deposited on the step feature at a first relative angle meets material deposited in surrounding areas at a different relative angle. The resulting seam defect is seen in the micrograph of FIG. 1A. The low quality of material adjacent to these seams is particularly evident when wet etching is used to remove poor quality deposited material, which preferentially etches the material found along the seams leaving voids as are visible in FIG. 1B. These examples represent a typical situation, as deposition of thin films commonly is performed on three dimensional surfaces. Three dimensional surfaces are often involved at some stage of fabrication for most devices, for example, as a result of an accumulation of multiple steps of patterned deposition and etching. Variation in deposited thickness over substrate features can result in problems due to poor conformal coverage, build-up of surface irregularities, trapped voids, seams, and similar problems in the corners of the features. A conformal film is one that has a thickness that is the same everywhere. Variations in device dimensions and properties become more critical as device dimensions are scaled down in size.

It is generally appreciated that the deposited film properties such as density, stress, and optical indexes are dependent on deposition incidence angle. Poor film properties seem to be associated with higher incidence angles. The quality and conformality of films deposited on 3-D surfaces may thus be improved to some extent by controlling the angle of deposition on the substrate (tilting the substrate relative to direction of flux). In a tilted deposition process the substrate is typically also rotated in order to obtain uniform deposition around the 3-D features across the substrate surface. This technique is used in thin film evaporation and ion beam deposition systems, and has more recently has been extended to sputtering systems with the popularization of low pressure sputtering technology. Desirable properties of the film deposited on the bottom and sidewall features of a 3-D feature have been observed for incidence angles of up to, but not exceeding, a critical angle of 55-65 degrees for either bottom and sidewall surfaces. However, control of incidence angles can be achieved only at very beginning stage of the growth. During growth, the shape of the sidewall evolves, and eventually results in glancing deposition angle on the bottom as well as on sidewall surfaces. As a result, quality of deposited material in the corner may deteriorate.

In one known example, thin films are deposited using magnetron sputtering, with the sputtering source at a 45 degree angle to the substrate, and with the substrate rotating to accomplish even coating across the surface. This approach does improve the quality of sidewall coverage on three dimensional features because the sidewalls are deposited with material at an incidence angle nearer to normal. However, experiments conducted by the present inventors have revealed that even an angled deposition process of this kind eventually forms seam lines between field and feature deposition due to the evolution of the sidewall shape described above, albeit less pronounced than those formed in the process described with reference to FIGS. 1A and 1B. These seam lines can be seen in FIG. 2A. Subsequent evaluation by wet etching that is preferential to the lower quality material leaves voids along these seam lines at the periphery of the underlying three dimensional features as seen in FIG. 2B.

Another known ion etch assisted deposition method uses a dual ion beam approach, in which a beam with ion energies well above the material's sputtering threshold is directed to the surface during material deposition. This approach can be used to improve conformality of films deposited on 3-D surfaces. Specifically, in Improved step coverage by ion beam resputtering, J. Vac. Sci. Technol. 18(2), Harper, J. M. E., G. R. Proto, and P. D Hoh (March 1981) (the "Harper paper"), SiO2 films were deposited by an IAD method on a Nb substrate having approximately 90 degree steps, using a dual ion beam deposition system (IBD) in which the angle of incidence of the depositing neutral particles was 20 degrees from the substrate normal and the angle of incidence of the ions from the "assist" (etch) source was 20 degrees from the substrate normal or 40 degrees from the direction of the depositing angle. The general configuration of the system is seen in FIG. 3A. According to the Harper paper, the step coverage was improved, however, the methods in the Harper paper failed to achieve a satisfactorily conformal film. Films deposited according to these prior art methods show a re-entrant overhang of the coating 9 at features in the substrate 8, as seen in FIG. 3B, and/or tend to form a thin facet on the corner of the step, as seen in FIGS. 3C and 3D. Thus, there remains a need to improve upon this and the other known methods for ion etch assisted deposition.

Known methods have thus failed to provide films of desired quality, including films on surfaces with 3-D topology. Particularly, known methods generally result in films having incomplete conformality and uniformity of coverage over the substrate. Thus, a need exists in the art for improvements relating to thin film deposition methods.

SUMMARY

The forgoing limitations of the prior art can be overcome according to the present invention by depositing the film using a combination of a beam of energetic particles that forms a film on the surface, and a beam of ions that simultaneously etches the surface of the patterned wafer mounted on a rotated or sweeping substrate. The present invention comprises a method of utilizing differences in the deposition and etch rates at different angles to achieve improved film deposited film properties. Specifically, the system configuration is adjusted to provide: (a) approximately equal incidence angles of deposition and etch beam fluxes at any position on the feature; and (b) deposition (etch) angles of incidence obtained on the main surfaces of the features (e.g. base and sidewall of step or trench features) that are substantially equal. The deposition and etch fluxes are adjusted in a way that etch rate prevails over deposition rate at critical, and higher, incidence angles, thus removal of poor quality material is achieved.

According to an embodiment of the invention, an ion etch assisted deposition apparatus is used to deposit a thin film upon a substrate having a three dimensional feature. The apparatus includes an ion etching source and deposition source arranged at similar angles relative to the substrate and at an angle $\alpha$ relative to each other, where the angle $\alpha$ is selected to be substantially equal the supplement of the angle $\alpha'$ formed between the three dimensional feature on the substrate and the substrate surface.

Two modes of substrate motion may be used to accomplish uniform coating of three dimensional features: (a) rotation, and (b) sweeping. Sweeping motion can be suitable for three dimensional features which are elongated along one axis

DETAILED DESCRIPTION

Figure 4:
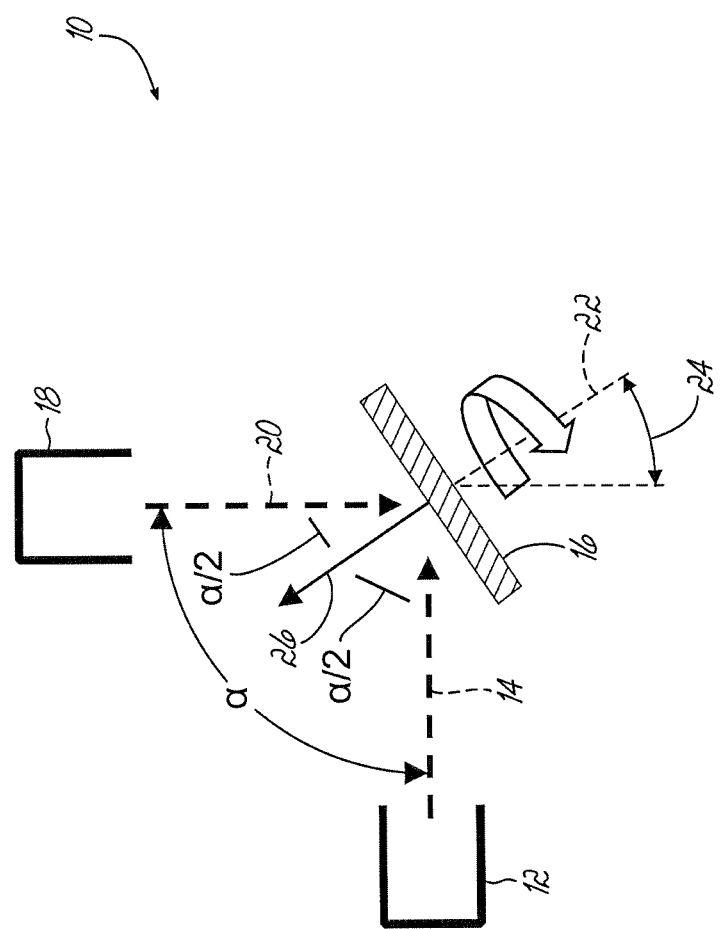
FIG. 4 is a schematic representation of a dual beam system for depositing a thin film in accordance with principles of the present invention, showing the preferred angle $\alpha$ between the dual ion sources.

Referring to the figures, and beginning with FIG. 4, a system for depositing a thin film in accordance with principles of the present invention is shown and is generally indicated by the numeral 10. The system 10 may be situated in an enclosed chamber, as is known in the thin film deposition art.

The system 10 includes a deposition source 12, which is the source of material that is to be deposited as a thin film on a surface. Any suitable deposition source may be used, and any suitable material may be used therewith. For example, a sputter target may serve as the source. The deposition source 12 directs particles of material along an axis 14 toward the surface of a substrate 16 that receives the material. Separately, an ion source 18 creates a beam of ions for etching the material deposited on the surface of the substrate 16, the beam of ions being directed along an axis 20 toward the surface of the substrate 16. The axis 14 and the axis 20 may represent the centerline of the deposition and etch beams, respectively. They generally intersect at the substrate 16 and may occupy the same plane. The relative position of the deposition source 12 and the ion source 18 is adjustable, with the adjustment of such being explained more fully below. The ion source may be an End Hall source or gridded ion source. It may also be substituted by any directed source of energetic particles capable of etching the substrate, e.g. a plasma beam etch or a neutral beam source.

The substrate 16 may be any substrate for receiving a thin film applied thereto, and may include 3-D topographic features, including, for example, steps or trenches. The substrate 16 is supported by a suitable structure for receiving material from the deposition source 12 and ions from the ion source 18. The substrate 16 may be tilted (as shown at 24) to an angle with respect to the deposition source 12 and the ion source 18. In particularly, the substrate tilt direction 24 may be along an axis that is orthogonal to both axes 14 and 20 of the deposition and etch beams, respectively: e.g., assuming axes 14 and 20 are in the same plane, the substrate surface normal 24 lies in the same plane. The substrate 16 may also be rotated around a central rotation axis 22 that is generally perpendicular to the surface of the substrate 16. It is assumed that the substrate surface is planar and the tilt angular orientation of the substrate defines the tilt angular orientation of the "flat" surfaces of the 3-D features, e.g. the bottoms or tops of steps or trenches.

Figure 5:
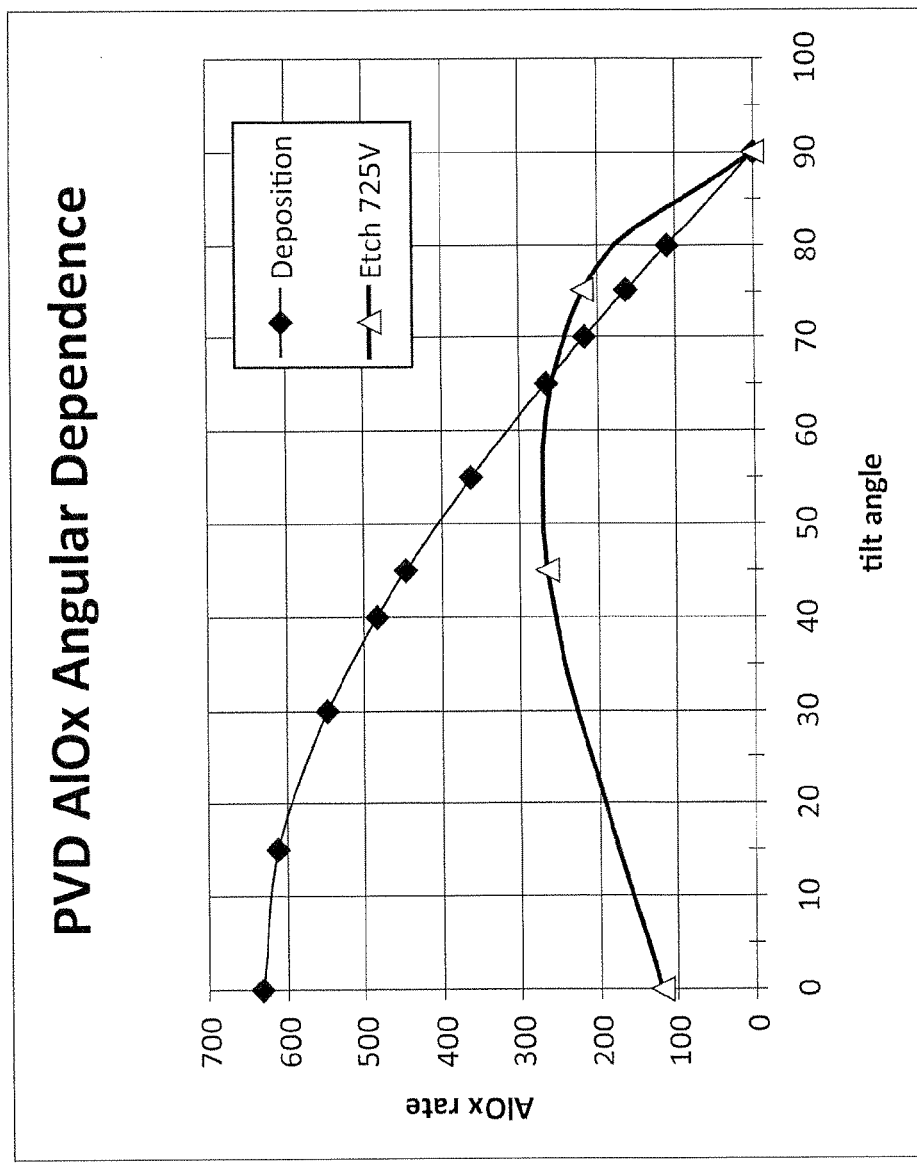
FIG. 5 is a diagram of deposition rate and etch rate of Aluminum Oxide by a magnetron sputtering deposition source and an End Hall ion beam etching source, respectively, shown as a function of the relative tilt angle between the source and substrate normal.

Referring now to FIG. 5, the deposition rate of source 12, and etch rate of source 18, and the angle of tilt of the deposition or etching axis away from perpendicular to the surface of a substrate can be discussed. While the data in this figure is specific to Aluminum Oxide deposited by magnetron sputtering and etched by an End Hall ion beam source, the trends shown are representative of many other materials and deposition and etch sources as well. It will be appreciated that the flux of particles created by the deposition source 12 represents a measure of the flow of material from the deposition source, and relates to the deposition rate at which material is added to the substrate 16. The flux of the ion beam created by the ion source 18 represents a measure of the flow of ions from the ion source, and relates to the etch rate at which material is removed from the substrate 16. Any suitable flux of the energetic particle beam and the ion beam may be used as long as the relative ratio of these fluxes is determined according to the methods of this invention, as described below.

It will be appreciated from FIG. 5 that the rates of deposition and etch are a strong function of the angle of incidence of the deposition and etch sources to the substrate. As can be seen, the deposition rate is at its greatest when the axis 14 of the deposition source is perpendicular to the substrate surface, which corresponds to a tilt angle of 0 degrees in the graph of FIG. 5. The deposition rate falls monotonically as the tilt angle increases, to a value of zero when the tilt angle reaches 90 degrees. The etch rate evidences an opposite trend, increasing monotonically with the tilt angle until the tilt angle reaches approximately 45 degrees, then decreasing monotonically.

As can be seen in FIG. 5, when, for example, the deposition and etch beams are incident on the substrate at the same angle, the etch and deposition fluxes may be selected such that there is a first range of tilt angles in which the deposition rate is greater than the etch rate, and a second range of tilt angles in which the etch rate exceeds the deposition rate. When thus adjusted, the apparatus precludes the deposition of material at angles within the second range, because any material deposited at this tilt angle is essentially immediately removed by the simultaneous etch process. Thus, adjustment of the deposition and etch rates to have the two ranges seen in FIG. 5 enables the deposition to be constrained to occur only in a desired range of tilt angles, such as tilt angles less than the critical angle above which poor quality of the deposited film is obtained, e.g. 65 degrees, as shown in FIG. 5 for alumina deposition.

In applying this concept to deposition on 3-D features, we require the deposition configuration to be arranged such that the main surfaces of the features (e.g. the "flat" surfaces and sidewalls of step or trenches) are subject to net quality deposition, i.e. to the first range of angles (less than the critical angle) described above. At the same time, other surfaces formed as a result of growth of deposited material at high incidence angles to the deposition beam resulting in poor quality deposition are exposed to the second range of angles mentioned above, i.e. these surfaces are etched instead of deposited. This is achieved for example by adjusting the angles of the deposition and etch beams on the substrate surface and on the sidewalls of the features to be equal; such a symmetrical treatment condition is also important to achieve a conformal coating (same net deposition thickness on sidewall and flat surfaces).

In practice, the thickness and properties of the deposited film will be determined by the cumulative effect of a number of factors, some of which are not considered in detail here, in particular resputtering of material from the bottom and sidewall and changes in the features as a result of growth. Thus in some useful or even preferred configurations the angular conditions may vary somewhat from those described above.

It is noteworthy that the etch source and deposition source will generally occupy different physical positions such that, at any instant in time, when etching three dimensional features some portions of said features will be exposed to different azimuthal angles of etch and deposition. However, if the polar deposition and etch incidence angles incident on the substrate surface are equal and the substrate is rotated by a sufficient number of revolutions during the coating process, the average etch and deposition angles at any point are essentially the same, which is sufficient.

Figure 6A:
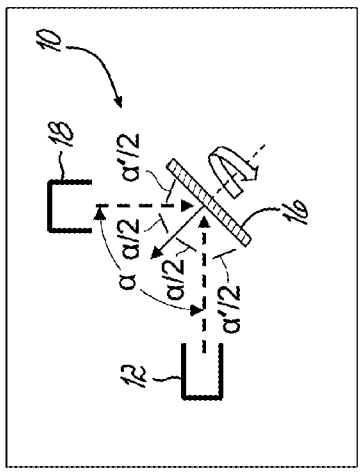
FIGS. 6A, 6B and 6C illustrate three relative angular configurations of the deposition and ion etch sources of FIG. 4, in which the sources are arranged at angles $\alpha$ which are selected to be supplementary to the angle $\alpha'$ between three dimensional features and the substrate as respectively shown in FIGS. 6D, 6E and 6F.
Figure 6B:
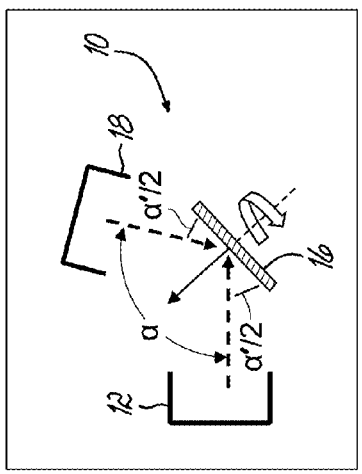
Figure 6C:
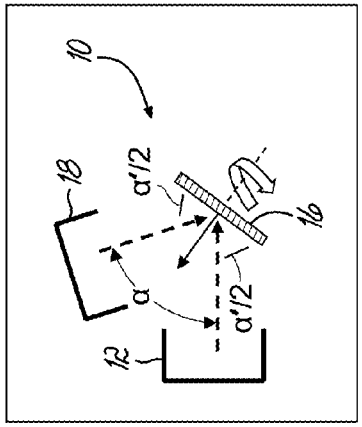
Figure 6D:
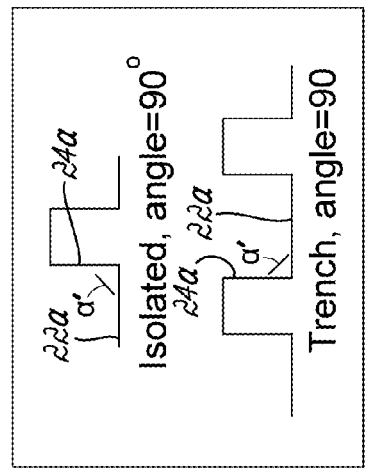
Figure 6E:
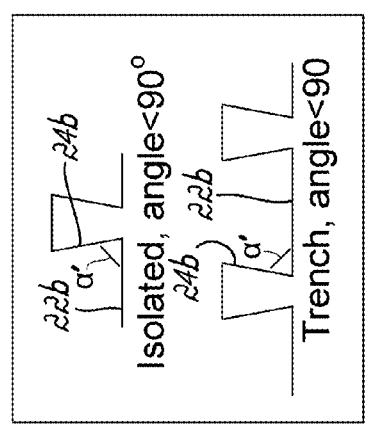

In practical implementations, illustrated diagrammatically in FIGS. 6A-6F, the system 10 of FIG. 4 permits deposition of high quality coatings upon surfaces having a variety of 3-D features. To ensure operation of the sources so that the simultaneous deposition and etch creates a high quality film and prevents growth of low quality film, the tilt angles of the sources 12 and 18 may be selected to correspond to the relative angles of the surfaces to be coated on the 3D features of the substrate. For example, as shown in FIG. 6D, the substrate features may include a base 22a which intersects with a sidewall 24a at a right angle, i.e., an angle α' of ninety degrees. Such a configuration is possible for both an isolated feature that generally extends upward from the rest of the surface, as well as a trench feature that extends downward below the rest of the surface. For this case, as seen in FIG. 6A the sources are placed at an angle of α of ninety degrees relative to each other. Secondly, the substrate is tilted such that the deposition and etch beams both bisect the angle between the base and the sidewall, resulting in equal deposition and etch angles at these main surfaces. In this case, both deposition and etching upon the main surfaces will operate in the range of 45 degrees to the substrate normal or at 45 degrees to the surface of the substrate. Thirdly, the deposition and etch fluxes are adjusted as shown in FIG. 5, in which the deposition rate is equal to the etch rate at a critical angle (65 degrees in the figure) above which the deposited film quality is poor. Thus the deposition rate exceeds the etch rate on the main surfaces (at 45 degree incidence angle to the substrate normal) whereas the etch rate exceeds the deposition rate at angles above said critical angle.

As shown in FIG. 6B, a base 22b may intersect with a sidewall 24b at an angle α' that is somewhat less than ninety degrees (e.g. 80 degrees). Such a configuration is possible for either step or trench features. For this case, to achieve equal angles of deposition and etch on the base and sidewalls of the features, as seen in FIG. 6B, the sources are placed at an angle α (e.g. 100 degrees) relative to each other, where a is supplementary to α', i.e., α+α'=180 degrees, and secondly the substrate is tilted to an angle of α'/2 (e.g. 40 degrees) from the deposition and etch beams to the substrate surface. As in the case above, the deposition and etch beams bisect the angle between the base and the sidewall. The angle of incidence of the deposition and etch beams to these surfaces, relative to the substrate normal (as referred to in FIG. 5), is α/2 (e.g. 50 degrees). The deposition and etch fluxes are adjusted as described for FIG. 6A.

Figure 6F:
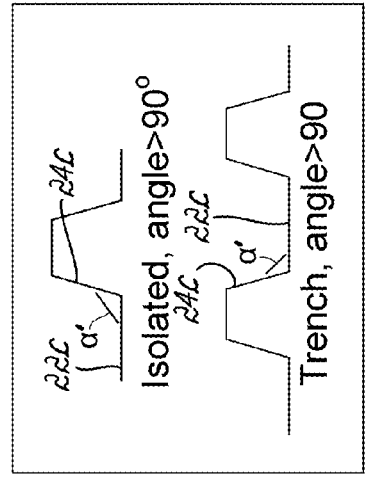

And as shown in FIG. 6C, a base 22c may intersect with a sidewall 24c at an angle α' that is somewhat greater than ninety degrees (e.g. 100 degrees). Such a configuration is possible for both a step or trench feature. In such a case, as before, to achieve equal angles of deposition and etch on the main surfaces, the sources are located at an angle α (e.g. 80 degrees) relative to each other, where α+α'=180 degrees, as seen in FIG. 6F and the tilt angle of the substrate is adjusted such that the angle of each beam bisects the angle between the base and the sidewall, i.e. the angle to the substrate surface is α'/2 (e.g. 50 degrees) The angle of incidence to the substrate normal of the deposition and etch beams on the main features (as referred to in FIG. 5) is α/2 (e.g. 40 degrees), well within the range of high quality deposition. The deposition and etch rate fluxes are adjusted as described for FIG. 6A.

Generally, the relative position of the deposition source 12 and the ion source 18 is adjusted so that the angular separation between the deposition source axis 14 and the ion source axis 20 is generally supplementary to the angle α' of one or more features on the surface of the substrate 16. Thus, where the base 22a and sidewall 24a intersect at a right angle (FIG. 6D), the angle between the deposition source axis 14 and the ion source axis 20 is generally also a right angle (FIG. 6A).

Similarly, where the base 22b and sidewall 24b intersect at an angle α' that is less than ninety degrees (FIG. 6E), the angle between the deposition source axis 14 and the ion source axis 20 is generally greater than ninety degrees, for example, 180-α' (FIG. 6B).

And where the base 22c and sidewall 24c intersect at an angle α' that is greater than ninety degrees (FIG. 6F), the angle between the deposition source axis 14 and the ion source axis 20 is generally less than ninety degrees, for example, 180-α' (FIG. 6C).

Generally, the substrate 16 may be tilted with respect to the deposition source 12 and the ion source 18 so that the deposition source axis 14 and the ion source axis 20 are an equal angular distance from the substrate rotation axis 22. Thus, as shown in FIGS. 4 and 6A-6F, the deposition source axis 14 is spaced from the substrate rotation axis 22 (which is collinear with the substrate surface normal 26 passing through the substrate center point) by half of α, or α/2, and the ion source axis 20 is similarly spaced from the substrate rotation axis 22/surface normal 26 by half of α, or α/2, where α=180-α'.

Figure 7:
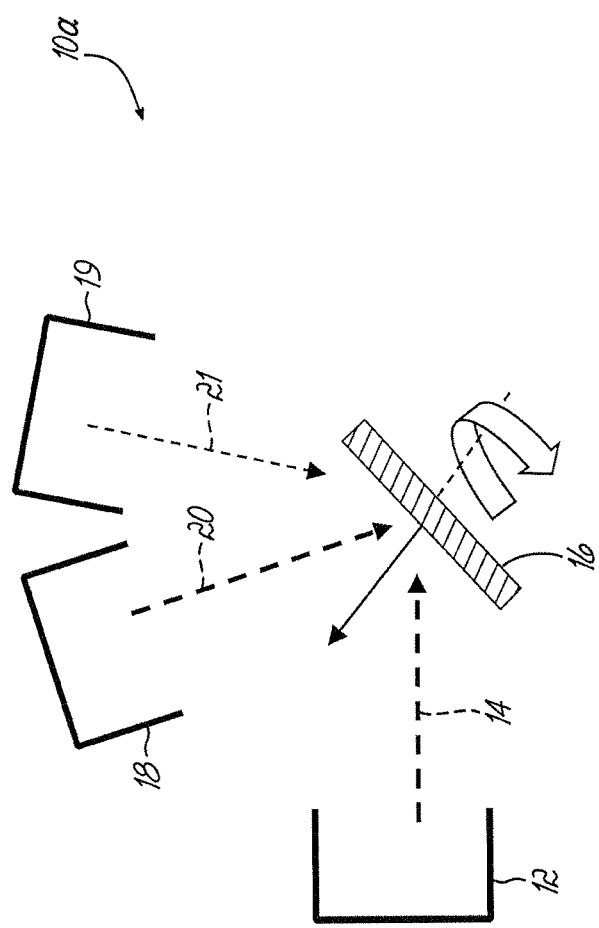
FIG. 7 is a schematic representation of an alternative system for depositing a thin film that may permit greater ion etch uniformity or power in some embodiments.

Turning to FIG. 7, another embodiment of a system for deposition a thin film is shown and is indicated by the numeral 10a. The system 10a includes the features of system 10 discussed above, as well as a second ion source 19 that creates a beam of ions that are directed along an axis 21 toward the surface of the substrate 16. The second beam may improve uniformity across the substrate surface, and/or assist in the generation of sufficient energetic ions to accomplish a desired etch rate.

Figure 8:
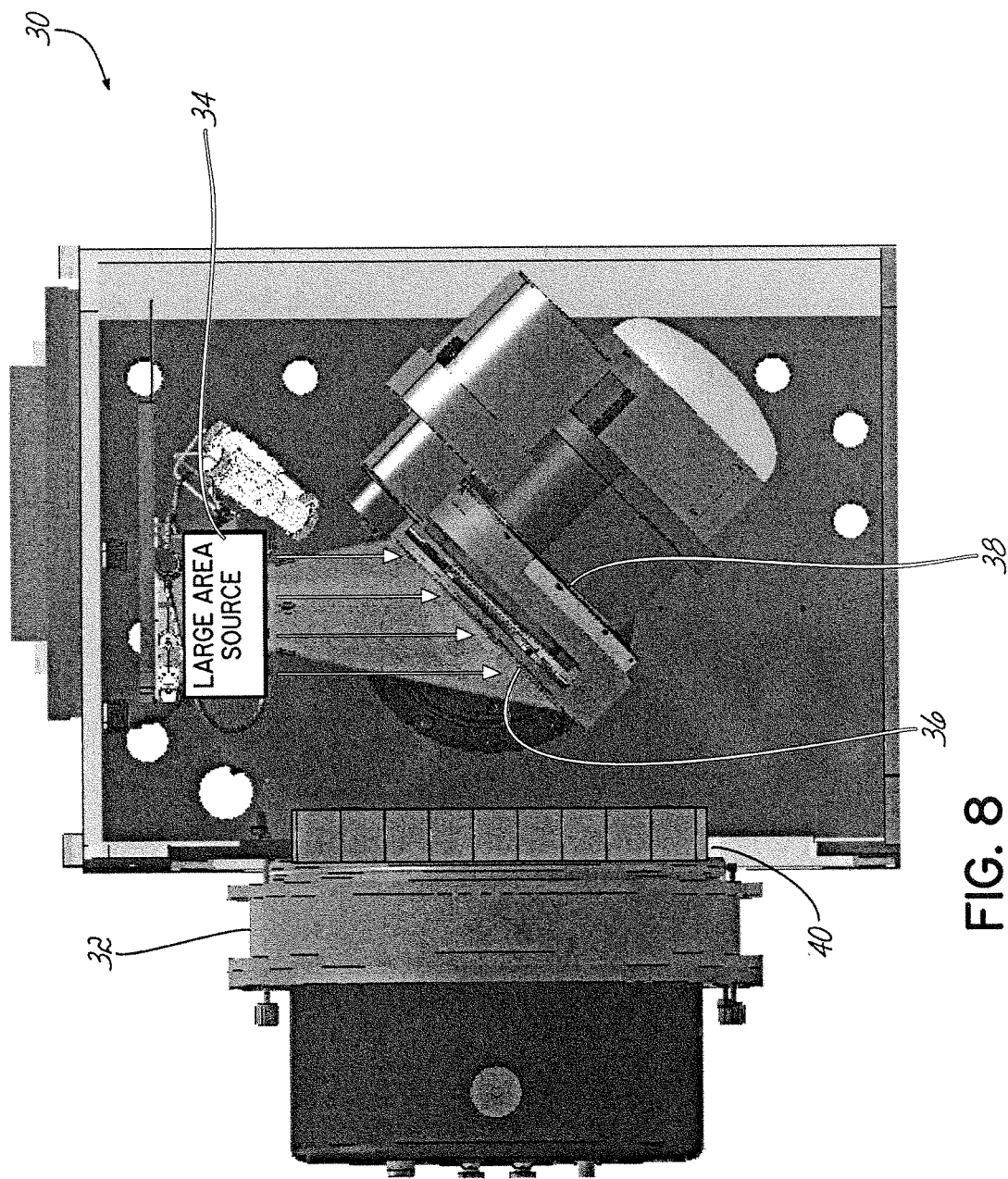
FIG. 8 is a plan view of a system for depositing a thin film showing greater detail on the structures involved.

Turning to FIG. 8, a more detailed embodiment of a system for deposition of a thin film is shown and is indicated by the numeral 30. The system 30 includes magnetron 32 as a deposition source and a multi-beamlet large gridded ion source 34 as an ion source. A substrate 36 for receiving a thin film is positioned on a fixture 38, which provides for tilting and rotation of the substrate 36. Fixture 38 is also capable of performing a sweep motion around a defined azimuthal index angle, sweeping in a specified range of azimuthal angles relative to the index angle, and both positive and negative directions, as is illustrated and discussed below with reference to FIG. 13. A collimator 40 is provided between the magnetron 32 and the fixture 38.

Figure 9:
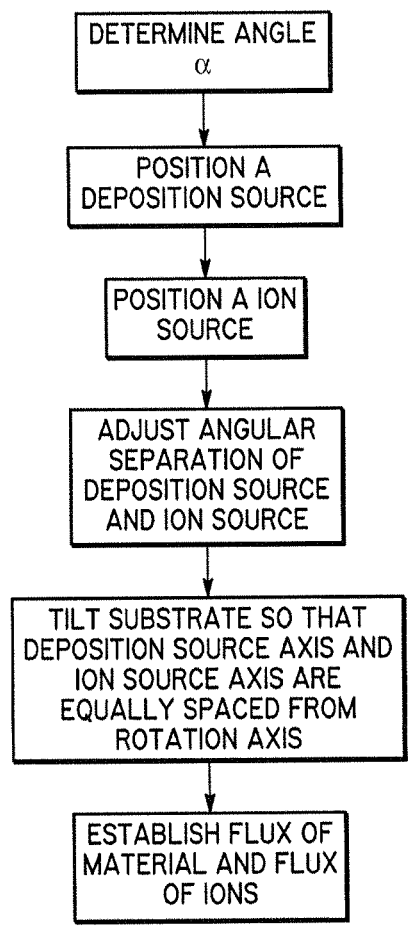
FIG. 9 shows steps for depositing a thin film on a surface of a substrate according to the invention disclosed herein.
Figure 10A:
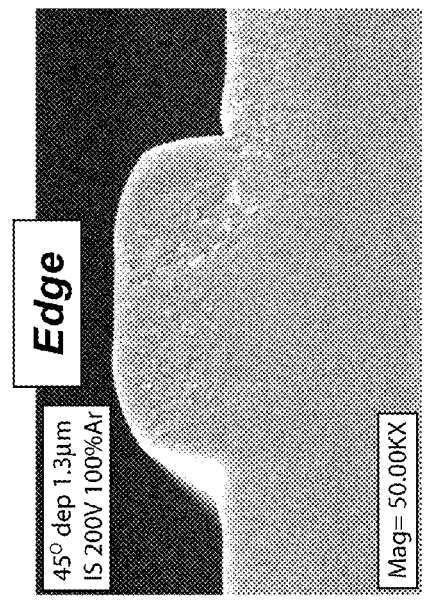
FIGS. 10A, 10B show the step coverage obtained on a substrate with features with sidewall angles $\alpha'$ of approximately 90 degrees, in the center and near the edge of the substrate showing the absence of seam lines before wet etching.
Figure 10B:
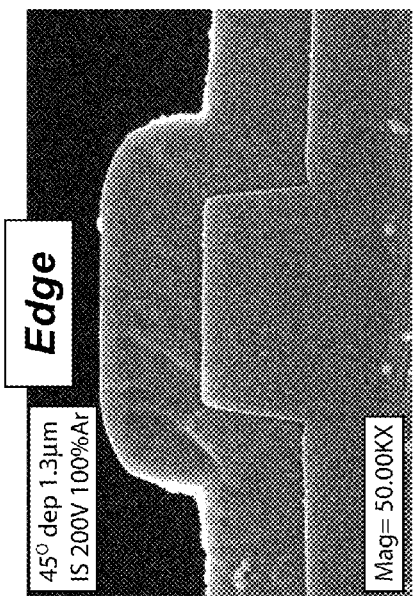
Figure 10C:
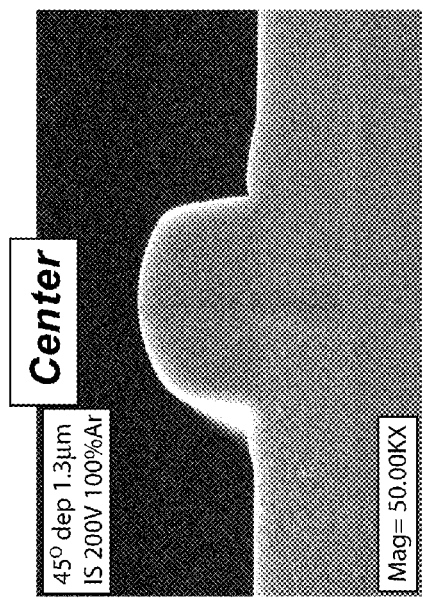
FIGS. 10C and 10D show the same structures after wet etching, for showing the absence of voids.
Figure 10D:
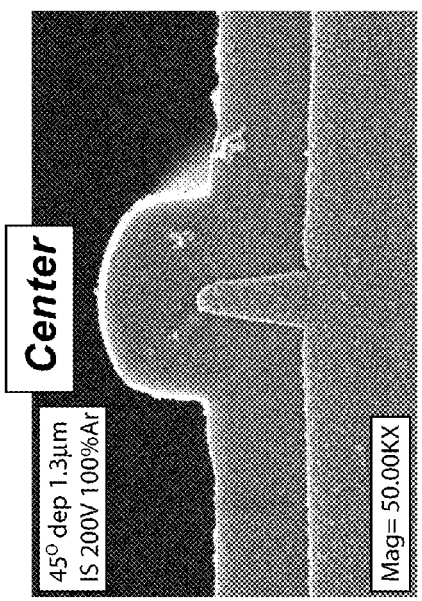

Referring now to FIG. 9, a method for depositing a thin film on a surface of a substrate according to the invention disclosed herein is performed using a system that includes a deposition source, an ion source, and a substrate, the substrate being supported and capable of tilting with respect to the deposition source and the ion source, and being capable of rotating about a central rotation axis. If not already known, the 3-D topographic features of the surface of the substrate that will receive the thin film are investigated so as to determine an angle of intersection α' for a feature of critical interest on the surface of the substrate. The deposition source is positioned so that a beam of energetic particles of material created thereby is directed at the substrate along a deposition source axis, and the ion source is positioned so that a beam of ions created thereby is directed at the substrate along an ion source axis. The angular separation between the deposition source axis and the ion source axis is adjusted in proportion to the angle α'. In some embodiments, the angular separation between the deposition source axis and the ion source axis is adjusted so as to be substantially supplementary to α'. The substrate may be tilted so that the deposition source axis and the ion source axis are equally angularly spaced from the central rotation axis about which the substrate may be rotated, and thus generally at an angle of α'/2 from the plane of the substrate. The flux of material from the deposition source and the flux of material from the ion source may be adjusted so as to provide an etch rate equal to or higher than a deposition rate when the incidence angles are approximately equal to or greater than a critical incidence deposition angle, which critical angle is the angle beyond which the final film properties begin deteriorating at an unsatisfactory rate.

Exemplary thin films were prepared according to the teachings contained herein, as will be detailed below. The description of following examples provides illustrations only and does not limit the scope of the present invention.

Example 1

Al2O3 films were deposited on 8" Si wafer with plurality of 1 μm height isolated SiO2 features with shape close to rectangular.

The deposition was performed in a chamber that was configured with pulsed DC magnetron and End Hall ion beam source. An Aluminum target and an Argon/Oxygen gas mixture was used for sputtering. The samples were deposited using the "metal mode" of deposition, operating with high speed O2 partial pressure feedback control. The use of high speed partial pressure control eliminates the transition to a "poisoned" target typically seen without active feedback and allows for Al2O3 deposition rates up to 5× higher than those obtained with the same target power in poisoned mode. Argon was used as feed gas for End Hall source. The system used a tiltable substrate fixture to allow for variable process angle deposition (with respect to substrate surface normal). The substrate temperature was maintained by the Flowcool™ helium backside gas cooling system. The system has a fixture shutter to allow for in-situ pre-clean of the target prior to deposition.

Configuration was set up: angle α between axis of sputtered material and axis of ion beam was set 1 to 90°, and corresponded to a 90° angle α' between bottom and side wall in the corners of the feature; incidence angles for deposition and etch were each 45° or α'/2. The fluxes of the sputtered beam, and the beam of ions were adjusted to provide etch rate equal to deposition rate at a 65 degree critical incidence deposition angle: Magnetron sputtering power was 6.5 kW; End Hall beam voltage and current were 200V and 15 A respectively.

The results of this process include: Optical spectra: index n~1.66, extinction coefficient k'0, which evidence good film quality; net deposition rate: 600 A/min; uniformity over 8" area: 2.5%. A SEM image of the rectangular feature cross-section is shown in FIGS. 10A-10D. The image of the as-deposited film (FIGS. 10A, 10B) demonstrated no seam lines or crevices, uniform contrast is evidence of uniform structure (no pores, good density) around the corner area, good conformality in the center and at the edge (8" diameter). The image of the samples after standard etch test (FIGS. 10C, 10D) demonstrated good quality with no voids.

Example 2

Cr films were deposited on an 8" Silicon wafer with plurality of 1 μm high isolated Silicon dioxide (SiO2) features and trenches with shape close to rectangular, trench aspect ratio (AR)~1:2.

The deposition was performed in a chamber that was configured with pulsed DC magnetron, and End Hall source (see Example 1). A Chromium target and an Argon gas were used for sputtering. Argon was used as a feed gas for the End Hall source.

Configuration was set up: angle α between axis of sputtered material and axis of ion beam was set to 90°, and corresponded to the angle α' of 90° between bottom and side wall in the corners of the feature; incidence angles for deposition and etch were α'/2=45°. The fluxes of the sputtered beam, and the beam of ions were adjusted to provide etch rate equal to deposition rate at a 65 degree critical incidence deposition angle: Magnetron sputtering power was 2.5 kW; End Hall beam voltage and current were 175V and 12 A, respectively.

Figure 11B:
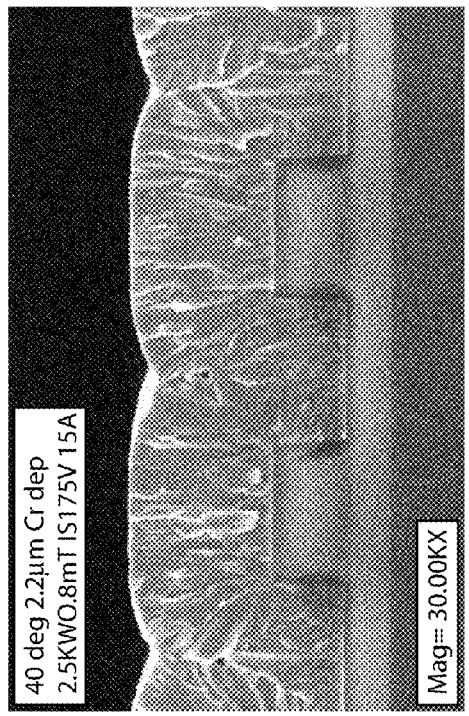
FIGS. 11A and 11B show thick Chromium deposition on a substrate having vertical sidewalls at a similar angle of $\alpha'=90$ degrees, showing the absence of seam lines and effective fill and planarization.
Figure 11A:
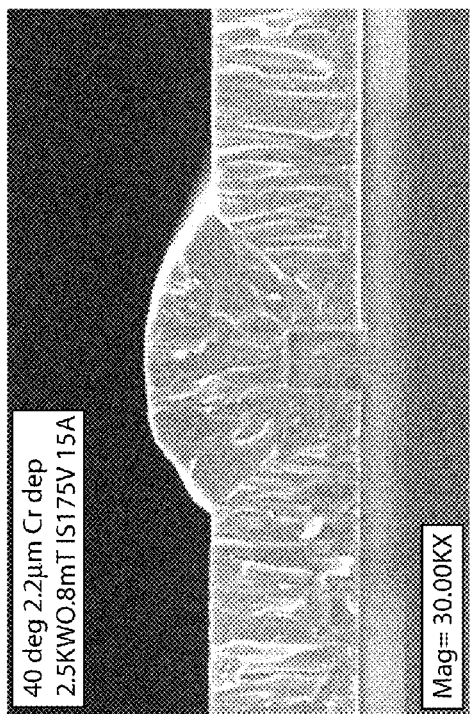

Results of Example 2 are seen in FIGS. 11A-11B in a "fill" or planarization application: Thickness of the deposited film ~2.3 μm, resistivity ~20 ohm/cm2 is evidence of good quality; deposition rate: 300 A/min; uniformity over 8" area: 3%. A SEM image of a feature with rectangular cross-section is shown in FIG. 11A—the image demonstrated no seam line, or crevices, uniform no pores, good density around the corner area, and good conformality. A SEM image of a film/trench (AR=1:2) structure (FIG. 11B) also showed good density and conformality, no crevices, excellent planarization effect.

Figure 12A:
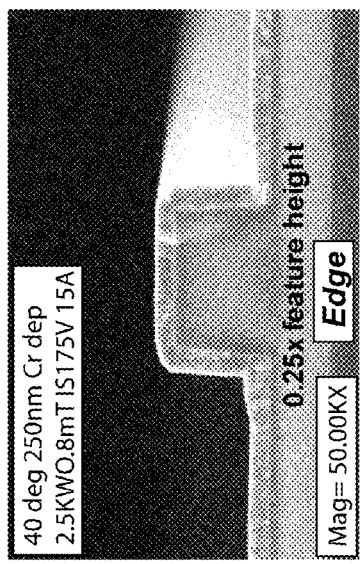
FIGS. 12A and 12B show the step coverage obtained on a substrate with isolated features with sidewall angles $\alpha'$ of approximately 90 degrees, in the center and near the edge of the substrate, showing the absence of seam lines.
Figure 12B:
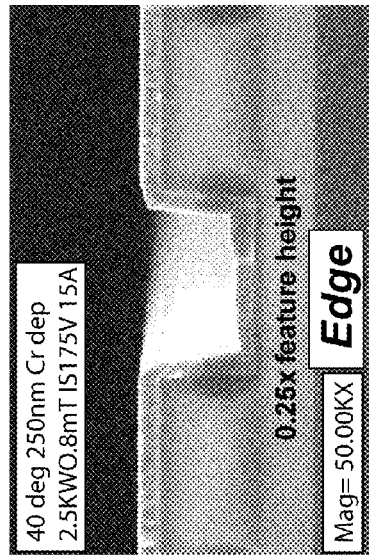
Figure 12C:
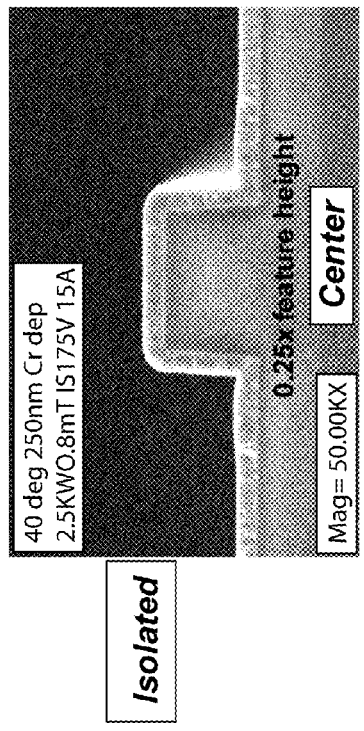
FIGS. 12C and 12D show similar good step coverage on trenches in the center and near the edge of the substrate.
Figure 12D:
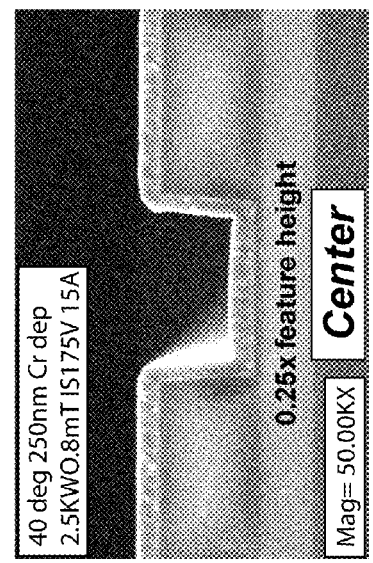

Further results of Example 2 for a "seed layer" application are seen in FIGS. 12A-12D. Thickness of the deposited film ~0.3 μm, uniformity over 8" area—3%; SEM images of the rectangular feature (FIGS. 12A and 12B), and trench cross-section (FIGS. 12C and 12D) demonstrated conformal deposition; corners are filled by material. Good results are seen in the substrate center (FIGS. 12A and 12C) as well as at edges (FIGS. 12B and 12D).

Example 3

Cr films were deposited on an 8" diameter Silicon wafer with plurality of 1 μm high isolated Silicon dioxide (SiO2) features with long axis and shape close to rectangular.

The deposition was performed in a chamber that was configured with pulsed DC magnetron, and End Hall source (see Example 2). A Chromium target and an argon gas were used for sputtering. Argon was used as a feed gas for the End Hall source.

The chamber was set up with the angle α between the axis of sputtered material and axis of ion beam equal to 90°, corresponding to the angle α' of 90° between bottom and side wall in the corners of the feature; incidence angles for deposition and etch were α'/2=45°. The fluxes of the sputtered beam, and the beam of ions were adjusted to provide etch rate equal to deposition rate at a 65 degree critical incidence deposition angle: Magnetron sputtering power was 5 kW; End Hall beam voltage and current=were 130V and 12 A, respectively.

Figure 13:
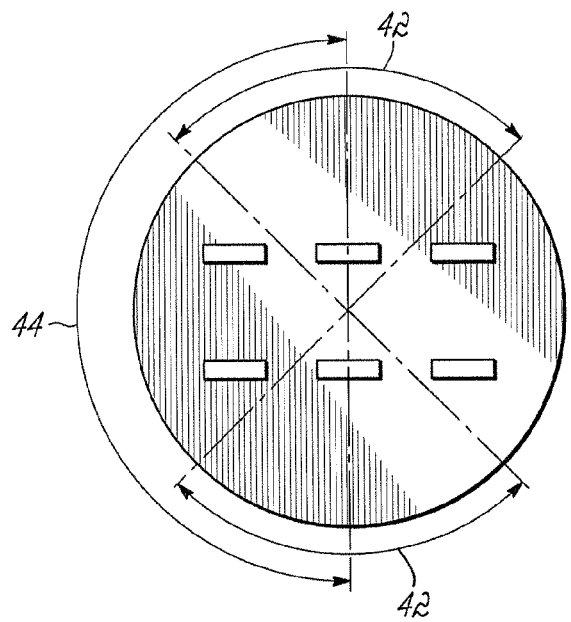
FIG. 13 is a schematic illustration of a sweeping motion in accordance with principles of the present invention, illustrating the movement relative to the orientation of the elongated axis of the substrate features during sequential sweeping, rotation (index change) and sweeping steps.

The substrate included elongated 3D features which are symmetrical to a long axis direction as illustrated diagrammatically in FIG. 13. For elongated features in such a configuration, equal deposition shape/thickness is accomplished on each elongated side of the feature using sweeping mode, as illustrated in FIG. 13, which uses a sweeping motion 42 and indexing motion 44 in combination. A typical range of sweeping motion 42 is ±30-70°, and ranges up to 90 degrees; an approximately ±45° sweep range 42 is illustrated in FIG. 13. Sweeping is performed around two or more azimuthal index angles, which are alternately selected by indexing motion 44 which rotates the wafer to each azimuthal index angle. At each azimuthal index angle sweeping motion is repeated a number of times. In the case illustrated in FIG. 13 there are two azimuthal index angles and the wafer is indexed between these angles with a 180° index motion 44. Any number of sweep cycles can be programmed, and more than two azimuthal index angles may be defined for a particular substrate feature configuration. The azimuthal index angles are set to obtain the desired orientation of the critical dimension of the feature to the deposition and etch beams for uniform coating of said feature. In the case of elongated features, the critical feature dimension is typically the long axis of the feature. The initial substrate azimuthal index angle is set such that the long axis/axes of the substrate features are orthogonal to the direction of the deposition and etch beams (axes 14 and 20 in FIG. 4) and parallel to the tilt axis of the substrate fixture. At this azimuthal index angle, one elongated side of the feature is exposed to deposition and shadowed from etch and the opposite elongated side of the feature is exposed to etch and shadowed from deposition. After 180 degree reorientation, the side previously exposed to deposition and shadowed from etch will be exposed to etch and shadowed from deposition, and vice versa. During processing, sweep motion 42 is performed around this azimuthal index angle within an azimuthal angle sweep range of, e.g., 45°, for a number of cycles. Then the substrate is rotated 44 to a new azimuthal index angle—in the illustrated case rotating 180° to a second index angle, and sweeping motion 42 is repeated at the new index angle for a number of cycles. The sweeping motion 42 and index motion 44 cycle occurs multiple times to deposit desired thickness of conformal identical coatings on both A and B sides.

For Example 3, the initial azimuthal index angle for sweeping was set perpendicular to the elongated axis of the substrate features as seen in FIG. 13. Sweeping was performed in a range of ±45°, and 60 sweep cycles were performed at each of two 180° opposed azimuthal index angles.

Results of Example 3 show the applicability of the invention for forming conformal films over step features without voids. Thickness of the deposited film ~1 μm, resistivity ~17 ohm/cm2 (evidencing good quality); deposition rate—: 650

Figure 14:
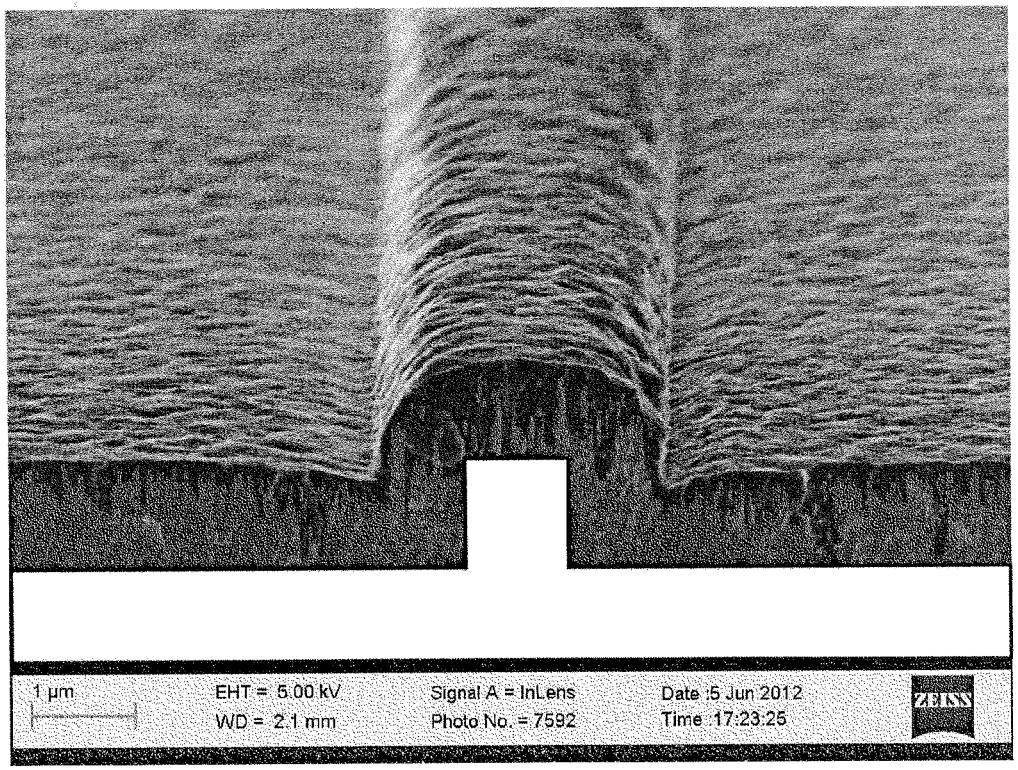
FIG. 14 shows deposition on a substrate having an elongated feature which extends on an axis perpendicular to the plane of the photograph, showing the absence of seam lines and effective fill and even coverage.

A/min; uniformity over 8" area: —4%. A SEM image of a feature with rectangular cross-section is shown in FIG. 14—the image demonstrated no seam line, or crevices, uniform no pores, good density around the corner area, and good conformality.

Electrical resistivity of the Chrome films deposited according the present invention averages approximately 20-25 ohm/cm$^2$, lower than the approximately 35-40 ohm/cm$^2$ average resistivity of the film deposited by magnetron sputtering with no etch assist, and matching good quality Cr bulk resistivity. With higher ion etch power, the resistivity of films decreases to below 20 ohm/cm$^2$ due to densification of the film.

Figure 1B:
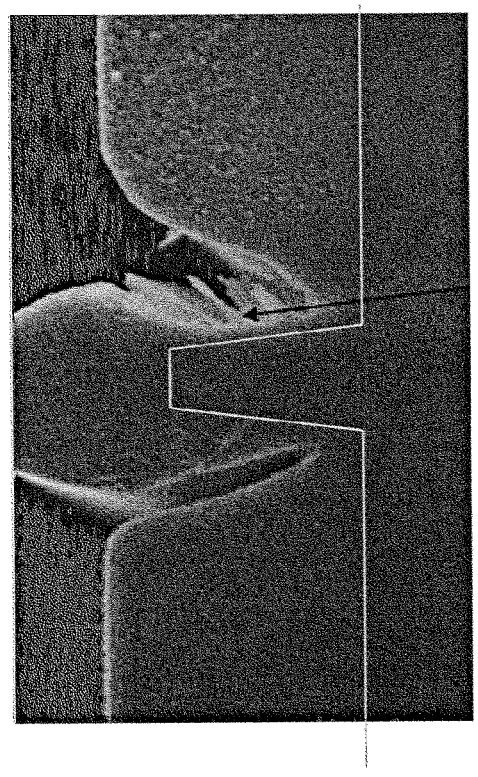
FIGS. 1A and 1B illustrate films deposited with a prior art process at a normal angle to the surface, before and after wet etching.
Figure 1A:
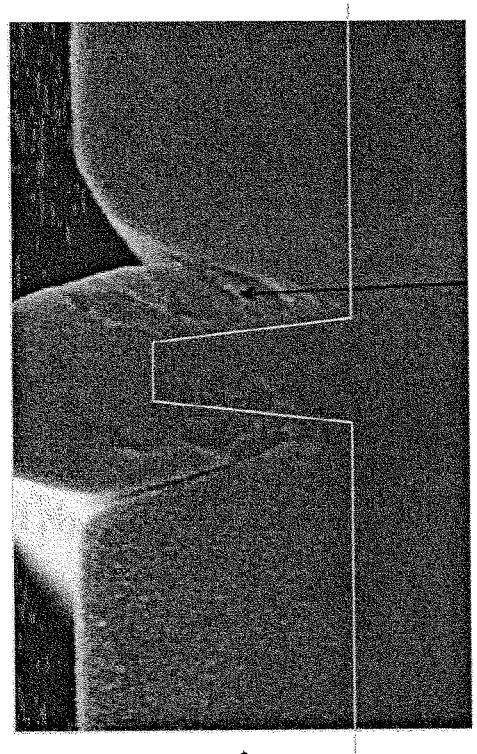
Figure 2B:
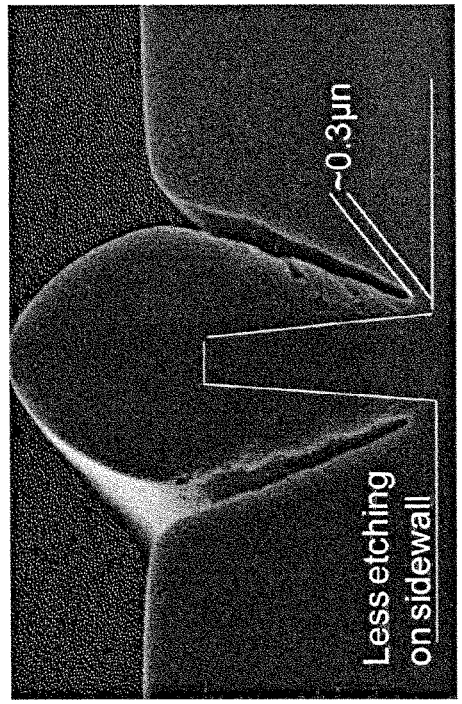
FIGS. 2A and 2B illustrate films deposited with a prior art process at an angle of approximately 45 degrees to the surface, before and after wet etching.
Figure 2A:
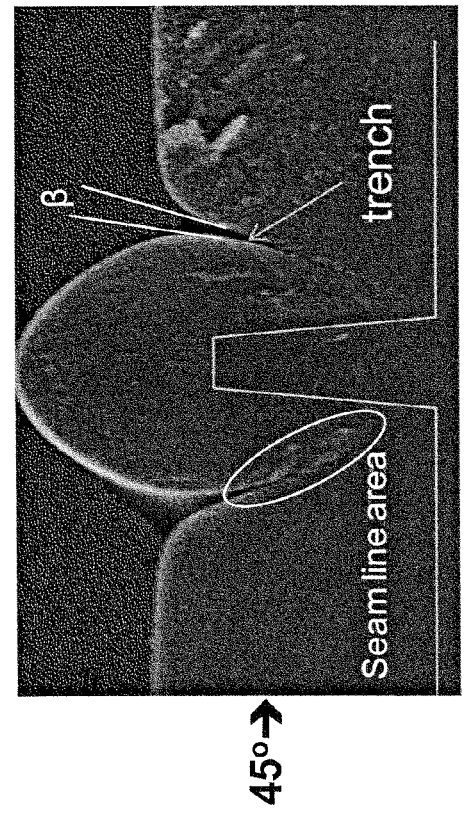
Figure 3A:
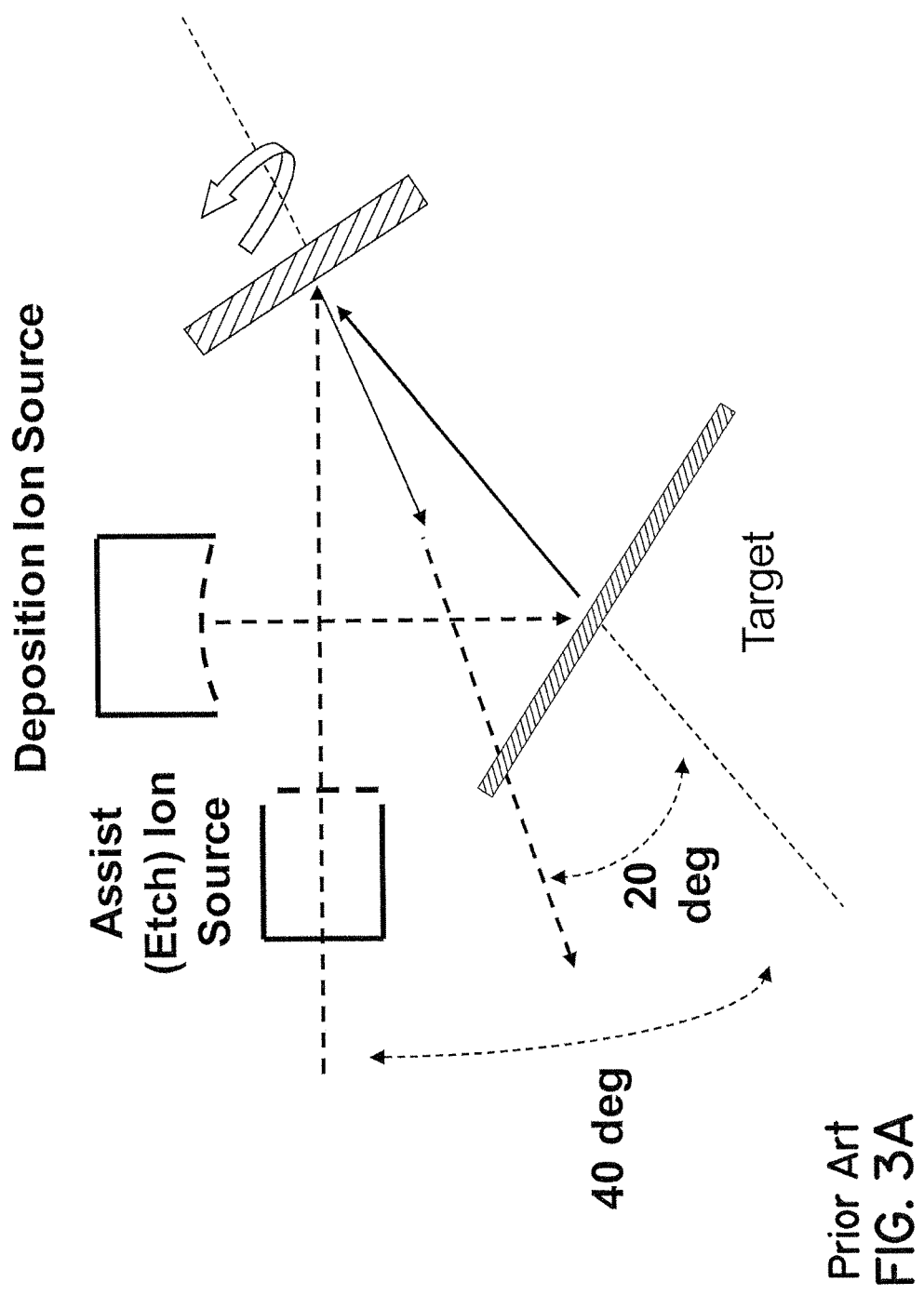
FIG. 3A is an illustration of a dual ion beam etch assisted deposition apparatus in accordance with the prior art.
Figure 3B:
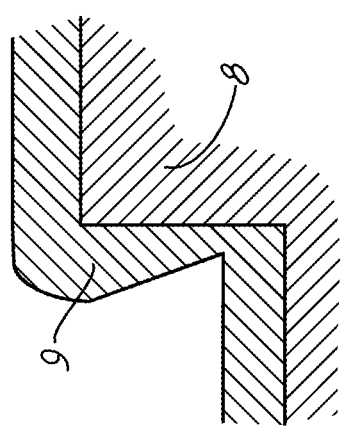
FIGS. 3B, 3C and 3D illustrate step coverage achieved with this apparatus.
Figure 3C:
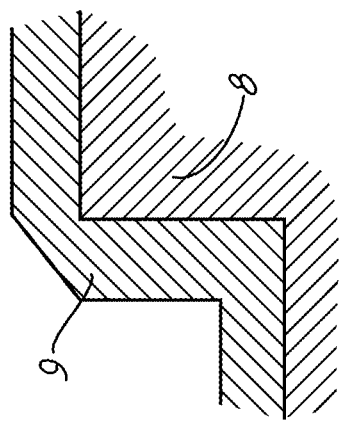
Figure 3D:
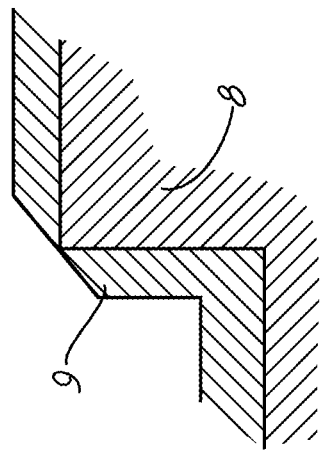

To demonstrate the beneficial effects of etch assist, a Cr film was deposited, without etch assist, on a substrate with isolated features having sidewalls at a 90 degree angle from the substrate plane. A fixture tilt of approximately 45 degrees was utilized to match the conditions used according with the invention. The deposited film evidenced a purely columnar structure, with crevices at the feature corners (similar to those seen in FIGS. 2A and 2B). The resistivity of the film was approximately 35 ohm/cm$^2$ compared with the resistivity of 20 ohm/cm$^2$ or below achieved with the present inventive process.

It will be appreciated that a novel and inventive surface processing system, and novel applications therefor, have been described here. Applicant does not intend by this description and the details thereof to limit the scope of the invention being sought to be protected, but rather, that protection is to be defined by reference to the following claims.

What is claimed is:

1. A method of thin film deposition of a conforming film on a substrate having a surface with a three dimensional feature the method comprising:
   rotating the substrate in a vacuum chamber;
   directing a beam of particles toward a surface of the substrate for deposition thereon;
   simultaneously directing a beam of energetic particles toward a surface of the substrate for etching thereof;
   wherein the beam of particles for deposition has an axis and the beam of particles for etching has an axis and said axes are arranged at an angular separation α relative to each other, wherein angular separation α is the supplementary angle of an angle α' formed between the three dimensional feature and the substrate surface, and wherein the substrate is tilted to an angle of approximately α'/2 relative to the axis of the beam of particles for deposition and the substrate is tilted to an angle of approximately α'/2 relative to the axis of the beam of particles for etching; and
   wherein the fluxes of the beam of particles and the beam of ions provide a net positive deposition rate in areas of the substrate where the incidence angle of said beams is less than a critical incidence angle, while also providing an average etch rate of the substrate surface that is equal or higher than the average deposition rate of said particles when the incidence angles of said beams is greater than a critical incidence deposition angle.

2. The method of claim 1 wherein the critical incidence deposition angle is between 55 to 75 degrees.

3. The method of claim 1 wherein the deposited dielectric film is Al2O3.

4. The method of claim 1 wherein other deposited thin film is selected from the group consisting of SiO2 and Ta2O5.

5. The method of claim 1 wherein the deposited thin film is selected from the group consisting of Al, Cr, Ti, and Ta.

6. The method of claim 1 wherein the deposited thin film is selected from the group consisting of Si and Ge.

7. The method of claim 1 wherein a beam of particles for deposition is generated by sputtering of target material.

8. The method of claim 7 wherein a beam of particles for deposition is generated by sputtering target material by gas ions.

9. The method of claim 8 wherein sputtering target material by gas ions comprises magnetron sputtering of target material.

10. The method of claim 9 wherein an erosion area of the target exceeds a diameter of the substrate.

11. The method of claim 8 wherein magnetron sputtering of target material comprises inert gas ions bombardment.

12. The method of claim 8 wherein magnetron sputtering of target material comprises inert gas and reactive gas ions bombardment.

13. The method of claim 12 wherein the inert gas is Ar, and the reactive gas is O2.

14. The method of claim 9 further comprising collimating particles with a physical collimator located 1-3 inches from the target in plane of target, between the target and the substrate.

15. The method of claim 1 wherein the beam of energetic particles is generated by extracting ions from at least one plasma source.

16. The method of claim 15 wherein the plasma source comprises single beam end hall ion source.

17. The method of claim 14 wherein the plasma source comprises a multibeamlet ion beam source.

18. The method of claim 17 wherein the multibeamlet ion source comprises a gridded large area ion source.

19. The method of claim 17 wherein the multibeamlet ion source comprises multiple end hall ion sources with outlets located in the same plane and with the same axis as single source.

20. The method of claim 15 further comprising adjusting an ion beam flux uniformity by adjusting the inert gas ion beam plume distribution.

21. The method of claim 20 wherein adjusting the inert gas ion beam plume distribution comprises tilting the ion source with respect to an axis normal to the plane of the substrate.

22. The method of claim 20 wherein adjusting the inert gas ion beam plume distribution comprises offsetting a central axis of the ion source relative to a center point of the substrate.

* * * * *